(12) United States Patent
Lee et al.

(10) Patent No.: US 11,910,652 B2
(45) Date of Patent: Feb. 20, 2024

(54) ORGANIC LIGHT EMITTING DISPLAY PANEL AND ORGANIC LIGHT EMITTING DISPLAY DEVICE INCLUDING THE SAME

(71) Applicant: LG Display Co., Ltd., Seoul (KR)

(72) Inventors: Younghee Lee, Paju-si (KR); HyunHaeng Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 256 days.

(21) Appl. No.: 17/532,417

(22) Filed: Nov. 22, 2021

(65) Prior Publication Data
US 2022/0208921 A1 Jun. 30, 2022

(30) Foreign Application Priority Data
Dec. 30, 2020 (KR) .......... 10-2020-0188268

(51) Int. Cl.
| | |
|---|---|
| H01L 27/14 | (2006.01) |
| H10K 59/121 | (2023.01) |
| H10K 59/123 | (2023.01) |
| H01L 29/786 | (2006.01) |
| H01L 27/12 | (2006.01) |

(52) U.S. Cl.
CPC ....... *H10K 59/1216* (2023.02); *H10K 59/123* (2023.02); *H10K 59/1213* (2023.02); *H01L 27/1225* (2013.01); *H01L 27/1255* (2013.01); *H01L 29/7869* (2013.01)

(58) Field of Classification Search
CPC .......... H10K 59/1216; H10K 59/1213; H10K 59/123; H10K 59/12; H10K 59/131; H01L 27/1225; H01L 27/1255; H01L 29/7869; H01L 27/124; H01L 27/1248; G09G 3/3225
USPC ....................................... 257/59, 72
See application file for complete search history.

(56) References Cited

U.S. PATENT DOCUMENTS 10,985,068 B2 * 4/2021 Lee .................. H10K 59/10

* cited by examiner

*Primary Examiner* — Tan N Tran
(74) *Attorney, Agent, or Firm* — LG Display Co., Ltd.

(57) ABSTRACT

The disclosure relates to an organic light emitting display panel and an organic light emitting display device including the display panel. Specifically, the organic light emitting display panel includes a buffer layer on a first conductive layer, an active layer on or over the buffer layer, a first insulating film on or over the active layer and overlapping a part of an upper surface of the active layer, a second insulating film on or over the first insulating film and including a first contact hole exposing the part of the upper surface of the active layer, an electrode of an organic light emitting element contacting the active layer through the first and second contact holes, wherein an area in which the active layer and a second conductive layer contact is included in a node at which a reference voltage is applied to a driving transistor.

20 Claims, 16 Drawing Sheets

FIG.16

|  | Comparative example | Embodiment |
|---|---|---|
| First sub-pixel | 145.97fF | 183.66fF |
| Second sub-pixel | 89.49fF | 123.56fF |
| Third sub-pixel | 132.05fF | 170.13fF |
| Fourth sub-pixel | 107.58fF | 163.58fF |

ORGANIC LIGHT EMITTING DISPLAY PANEL AND ORGANIC LIGHT EMITTING DISPLAY DEVICE INCLUDING THE SAME

CROSS-REFERENCE TO RELATED APPLICATION

This application claims the priority benefit Republic of Korea Patent Application No. 10-2020-0188268, filed on Dec. 30, 2020 in the Korean Intellectual Property Office, the disclosure of which is hereby incorporated by reference in its entirety.

BACKGROUND

Field of the Disclosure

The present disclosure relates to an organic light emitting display panel and an organic light emitting display device including the display panel.

Description of the Background

Organic light emitting display devices include one or more thin film transistors (TFT), a storage capacitor, and a plurality of lines.

One or more thin film transistors, a capacitor, and one or more lines may be implemented as fine patterns on a substrate included in the organic light emitting display device, and the display device can operate based on complex connections between one or more thin film transistors, at least one capacitor, and one or more lines.

Recently, there are growing needs for organic light emitting display devices with high luminance and high resolution, and to satisfy such needs, it would be desirable to provide an efficient space arrangement and connection structure between elements included in the organic light emitting display devices.

SUMMARY

Embodiments of the present disclosure provide an organic light emitting display panel having high luminance characteristics by increasing a size (area) of a light emitting area without reducing an area of a storage capacitor disposed in a non-light emitting area, and an organic light emitting display device including the display panel.

Further, embodiments of the present disclosure provide an organic light emitting display panel having high luminance and high resolution by increasing the capacity of a storage capacitor without reducing a size (area) of a light emitting area, and an organic light emitting display device including the display panel.

Further, embodiments of the present disclosure provide an organic light emitting display panel for easily driving sub-pixels by enabling an active layer to include an active pattern and a conductive pattern, and an organic light emitting display device including the display panel.

In accordance with one aspect of the present disclosure, an organic light emitting display panel and an organic light emitting display device including the display panel are provided, the display panel including a first conductive layer disposed on a substrate, a buffer layer disposed on the first conductive layer, an active layer disposed on or over the buffer layer, a first insulating film disposed on or over the active layer and overlapping a part of an upper surface of the active layer, a second insulating film disposed on or over the first insulating film and including a first contact hole exposing the part of the upper surface of the active layer, a third insulating film disposed on the second insulating film and including a second contact hole overlapping the first contact hole, an electrode of an organic light emitting element, such as an organic light emitting diode etc. disposed on the third insulating film and contacting the active layer through the first and second contact holes, wherein an area in which the active layer and a second conductive layer contact is an area included in a node at which a reference voltage is applied to a driving transistor.

In accordance with another aspect of the present disclosure, an organic light emitting display panel and an organic light emitting display device including the display panel are provided, the display panel including a first conductive layer disposed on a substrate, a buffer layer disposed on the first conductive layer, an active layer disposed on or over the buffer layer, a first insulating film disposed on or over the active layer and overlapping a part of an upper surface of the active layer, a plate disposed on the first insulating film, a second insulating film disposed on or over the plate and the first insulating film and including a first contact hole exposing the part of the upper surface of the active layer, a third insulating film disposed on the second insulating film and including a second contact hole overlapping the first contact hole, an electrode of an organic light emitting element, such as an organic light emitting diode etc. disposed on the third insulating film and contacting the active layer through the first and second contact holes, wherein each of the first conductive layer, the active layer, and the plate serves as an electrode of a storage capacitor, and the storage capacitor does not overlap the first and second contact holes.

In accordance with aspects of the present disclosure, by allowing the display panel to include a structure where an area in which an active layer and an electrode of an organic light emitting element contact each other is disposed in an area corresponding to a second node of a driving transistor, an area of a non-light emitting area can be reduced without reducing an area of a storage capacitor, and in turn, an area of a light emitting area relative to the non-light emitting area can be increased by the reduced area of the non-light emitting area, and thereby, it is possible to provide organic light emitting display panels having high luminance characteristics and organic light emitting display devices including the display panel.

In accordance with aspects of the present disclosure, as an area corresponding to a second node of a driving transistor includes an area in which a first conductive layer, an active layer, and a second conductive layer contact, and an area in which the active layer and an electrode of an organic light emitting element contact, and the second conductive layer does not extend up to the area in which the active layer and the electrode of an organic light emitting element contact, it is therefore possible to provide organic light emitting display panels capable of increasing an area of a plate, which is an electrode of a storage capacitor, disposed to be spaced apart from the second conductive layer, and increasing the capacity of the storage capacitor, and organic light emitting display devices including the display panel.

Further, in accordance with aspects of the present disclosure, as the active layer includes an active pattern and a conductive pattern disposed on the active pattern, it is possible to provide organic light emitting display panels in which sub-pixels can be easily driven and stability of manufacturing processes can be improved, and organic light emitting display devices including the display panel.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 16 is a diagram comparing capacities of respective storage capacitors of the organic light emitting display device according to one embodiment of the present disclosure and an organic light emitting display device according to a comparative example.

DETAILED DESCRIPTION

Figure 1:
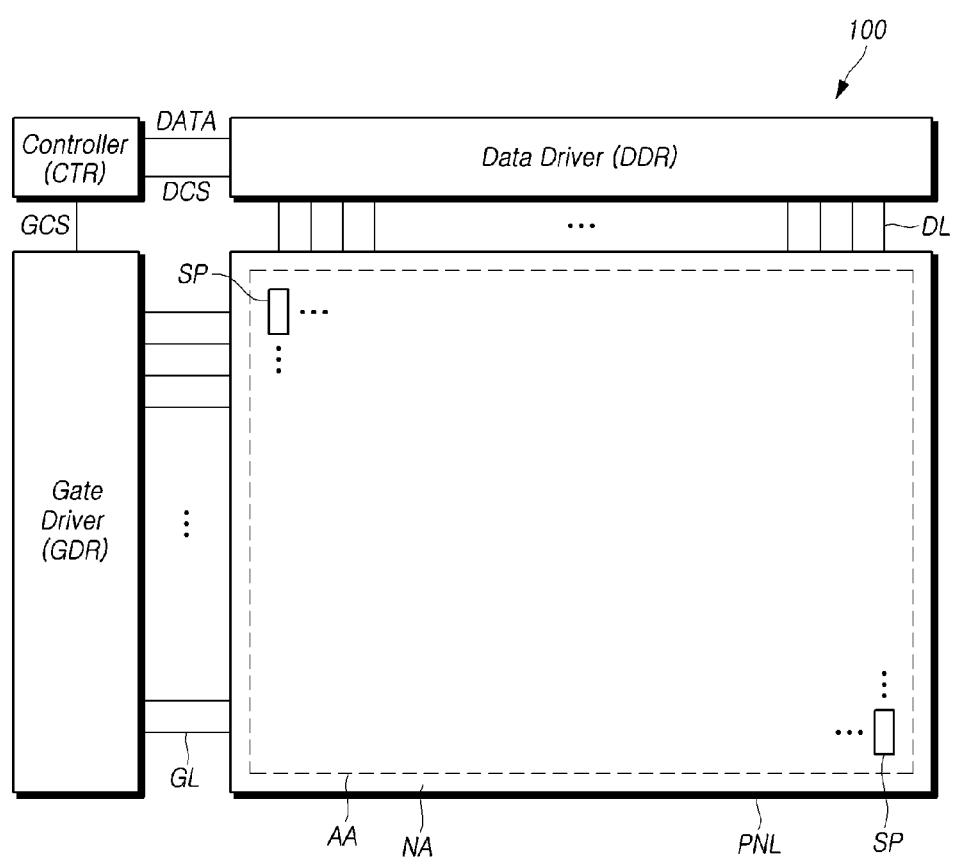
FIG. 1 schematically illustrates a system configuration of an organic light emitting display device according to one embodiment of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 schematically illustrates a system configuration of an organic light emitting display device according to one embodiment of the present disclosure.

Organic light emitting display devices according to aspects of the present disclosure may include an organic light emitting display device 100, a lighting device, a light emitting device, and the like. Hereinafter, for convenience of description, organic light emitting display devices according to aspects of the present disclosure will be described by focusing on the organic light emitting display device 100. However, it should be appreciated that as long as a transistor is included, embodiments described herein may be applicable to various organic light emitting display devices, such as the lighting device, the light emitting device, and the like, as well as the organic light-emitting display device 100.

The organic light emitting display device 100 according to one embodiment of the present disclosure includes an organic light emitting display panel PNL that displays an image or outputs light, and a driving circuit for driving the organic light emitting display panel PNL.

The organic light emitting display device 100 according to one embodiment of the present disclosure may be based on a bottom emission type in which light is emitted from an organic light emitting element toward a substrate over which the organic light emitting element is disposed. However, embodiments of the present disclosure are not limited thereto. In some embodiments, the organic light emitting display device 100 described herein may be based on a top emission type in which light is emitted from an organic light emitting element toward a surface opposite to the substrate on which the organic light emitting element is disposed, or based on a double-side emission type in which light is emitted from the organic light emitting element toward both the substrate and the surface opposite to the substrate.

The organic light emitting display panel PNL may include a plurality of data lines DL and a plurality of gate lines GL, and a plurality of sub-pixels SP defined by the plurality of data lines DL and the plurality of gate lines GL, and arranged in a matrix pattern.

The plurality of data lines DL and the plurality of gate lines GL may be arranged to intersect each other in the organic light emitting display panel PNL. In an embodiment, the plurality of gate lines GL may be arranged in rows or columns, and the plurality of data lines DL may be arranged in columns or rows. Hereinafter, for convenience of description and ease of understanding, it is assumed that the plurality of gate lines GL is arranged in rows and the plurality of data lines DL is arranged in columns.

In addition to the plurality of data lines DL and the plurality of gate lines GL, one or more other types of signal lines may be arranged in the organic light emitting display panel PNL according to sub-pixel structures or the like. A driving voltage line, a reference voltage line, or a common voltage line may be further disposed.

Types of signal lines disposed on the organic light emitting display panel PNL may vary depending on sub-pixel structures or the like. Further, all or some of each type of signal lines described herein may include all or at least a part of an electrode to which a signal is applied.

The organic light emitting display panel PNL may include an active area A/A on which images are displayed, and a non-active area N/A that is an outer edge, on which images are not displayed. Here, the non-active area N/A may be referred to as a bezel area.

A plurality of sub-pixels SP for image display is arranged in the active area A/A.

A pad portion including one or more conductive pads may be disposed in the non-active area N/A for an electrical connection with a data driver DDR, and a plurality of data link lines may be disposed in the non-active area N/A for electrically connecting between the pad portion and a plurality of data lines DL. Here, the plurality of data link lines may be parts of the plurality of data lines DL extending up to the non-active area N/A (e.g., from the active area A/A), or may be separate patterns electrically connected to the plurality of data lines DL.

Further, gate driving related lines may be arranged in the non-active area N/A to transmit a voltage (signal) needed for gate driving to a gate driver GDR through the pad portion to which the data driver DDR is electrically connected. In an embodiment, such gate driving related lines may include clock lines for carrying clock signals, gate voltage lines for transmitting gate voltages (VGH, VGL), and gate driving control signal lines for carrying various types of control signals required for generating scan signals. The gate driving related lines may be arranged in the non-active area N/A, differently from the gate lines GL disposed in the active area A/A.

The driving circuit may include a data driver DDR for driving a plurality of data lines DL, a gate driver GDR for driving a plurality of gate lines GL, and a controller CTR for controlling the data driver DDR and the gate driver GDR.

The data driver DDR can drive the plurality of data lines DL by applying data voltages to the plurality of data lines DL.

The gate driver GDR can drive the plurality of gate lines GL by supplying scan signals to the plurality of gate lines GL.

The controller CT) can control driving operations of the data driver DDR and the gate driver GDR by supplying various types of control signals (DCS, GCS) required for the driving operations of the data driver DDR and the gate driver GDR. Further, the controller CTR can supply image data DATA to the data driver DDR.

The controller CTR can start to scan a pixel according to a timing scheduled in each frame, convert image data inputted from the outside (e.g., a host system, other devices or other image providing sources) to a data signal type used in the data driver DDR and then output image data DATA resulting from the converting to the data driver DDR, and causes the data to be written into the pixel at a preconfigured time according to scan operation.

To control the data driver DDR and the gate driver GDR, the controller CTR can receive, from the outside (e.g., the host system, other devices or other image providing sources), timing signals, such as, a vertical synchronization signal Vsync, a horizontal synchronization signal Hsync, an input data enable (DE) signal, a clock signal, and the like. The controller CTR can generate various types of control signals using the received signals and supply such generated signals to the data driver DDR and the gate driver GDR.

In an embodiment, to control the gate driver GDR, the controller CTR can output several types of gate control signals GCS including a gate start pulse GSP, a gate shift clock GSC, a gate output enable signal GOE, and the like.

Further, to control the data driver DDR, the controller CTR can output several types of data control signals DCS including a source start pulse SSP, a source sampling clock SSC, a source output enable signal SOE, and the like.

The controller CTR may be a timing controller used in the typical display technology or a control apparatus/device capable of additionally performing other control functions in addition to the typical function of the timing controller.

The controller CTR may be implemented in a separate component from the data driver DDR or may be integrated with the data driver DDR into an integrated circuit.

The data driver DDR can drive a plurality of data lines DL by receiving image data DATA from the controller CTR and then supplying data voltages corresponding to the image data to the plurality of data lines DL. Here, the data driver DDR is sometimes referred to as a source driving circuit or a source driver.

The data driver DDR can transmit various signals to, or receive various signals from, the controller CTR through various interfaces.

The gate driver GDR can sequentially drive a plurality of gate lines GL by sequentially supplying scan signals to the plurality of gate lines GL. Here, the gate driver GDR is sometimes referred to as a scan driving circuit or a scan driver.

According to the control of the controller CTR, the gate driver GDR can sequentially supply scan signals representing an on-voltage or an off-voltage to the plurality of gate lines GL.

When a specific gate line is asserted by a scan signal from the gate driver GDR, the data driver DDR can convert image data DATA received from the controller CTR into analog data voltages and supply the obtained data voltages to the plurality of data lines DL.

The data driver DDR may be located on, but not limited to, only one side (e.g., an upper side or a lower side) of the display panel PNL, or in some embodiments, be located on, but not limited to, two sides (e.g., the upper side and the lower side) of the display panel PNL according to driving schemes, design schemes of display panels, or the like.

The gate driver GDR may be located on, but not limited to, only one side (e.g., a left side or a right side) of the panel PNL, or in some embodiments, be located on, but not limited to, two sides (e.g., the left side and the right side) of the display panel PNL according to driving schemes, design schemes of display panels, or the like.

The data driver DDR may be implemented by including one or more source driver integrated circuits SDIC.

Each source driver integrated circuit SDIC may include a shift register, a latch circuit, a digital-to-analog converter DAC, an output buffer, and the like. In some embodiments, the data driver DDR may further include one or more analog-to-digital converters ADC.

Each source driver integrated circuit SDIC may be connected to a conductive pad such as a bonding pad of the organic light emitting display panel PNL in a tape automated bonding (TAB) type or a chip on glass (COG) type, or be directly disposed on the display panel 110. In some embodiments, each source driver integrated circuit SDIC may be integrated into the organic light emitting display panel PNL. In some embodiments, each source driver integrated circuit SDIC may be implemented in a chip on film (COF) type. In this instance, each source driver integrated circuit SDIC may be mounted on a circuit film, and electrically connected to data lines DL in the organic light emitting display panel PNL through the circuit film.

The gate driver GDR may include a plurality of gate driving circuits GDC. The plurality of gate driving circuits GDC may correspond to a plurality of gate lines GL, respectively.

Each gate driving circuit GDC may include a shift register, a level shifter, and the like.

Each gate driving circuit GDC may be connected to a conductive pad such as a bonding pad of the organic light emitting display panel PNL in the tape automated bonding (TAB) type or the chip on glass (COG) type. In some embodiments, each gate driving circuit GDC may be implemented in the chip on film (COF) type. In this instance, each gate driving circuit GDC may be mounted on a circuit film, and electrically connected to gate lines GL in the organic light emitting display panel PNL through the circuit film. Further, each gate driving circuit GDC may be implemented in a gate in panel (GIP) type and may be embedded in the organic light emitting display panel PNL. That is, each gate driving circuit GDC may be directly formed in the organic light emitting display panel PNL.

Figure 2:
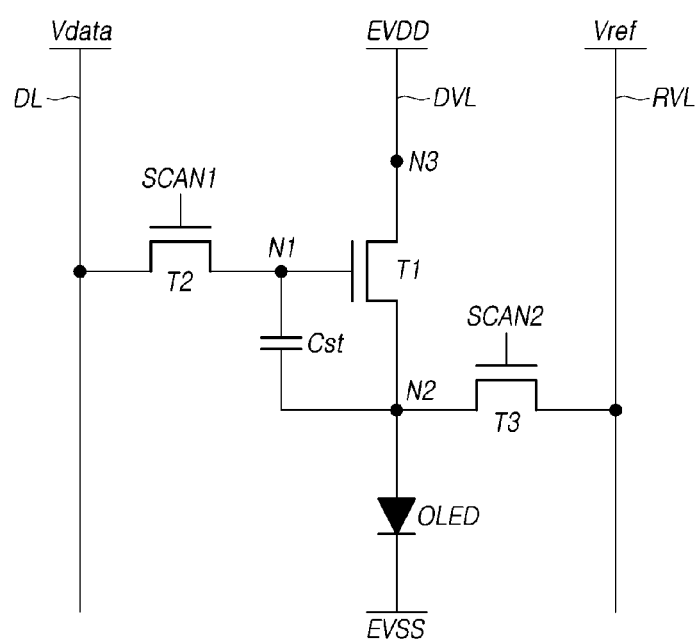
FIG. 2 illustrates a sub-pixel structure when an organic light emitting display panel including organic light emitting diode (OLED) is employed in the display device according to one embodiment of the present disclosure.

FIG. 2 illustrates a sub-pixel SP structure when an organic light emitting display panel PNL including an organic light emitting element such as an organic light emitting diodes (OLED) is employed in the display device according to aspects of the present disclosure.

Referring to FIG. 2, each sub-pixel SP in the organic light emitting display panel PNL including the organic light emitting element may include a second transistor T2 passing a data voltage Vdata to a first node N1 corresponding to a gate node of a driving transistor T1, and a storage capacitor Cst for maintaining the data voltage Vdata corresponding to an image signal voltage or a voltage corresponding to this during one frame time.

The organic light emitting element OLED may include a first electrode (an anode electrode or a cathode electrode), an organic layer including at least one emission layer, and a second electrode (the cathode electrode or the anode electrode).

In one embodiment, a base voltage EVSS such as a low-level voltage may be applied to the second electrode of the organic light emitting element OLED.

The driving transistor T1 can drive the organic light emitting diode OLED by supplying a driving current to the organic light emitting diode OLED.

The driving transistor T1 may have the first node N1, a second node N2, and a third node N3.

The "node" of the first to third nodes N1, N2, and N3 may denote a point, one or more electrodes, or one or more lines, which have an equal electrical state.

Each of the first node N1, the second node N2, and the third node N3 may be made up of one or more electrodes.

The first node N1 of the driving transistor T1 may be a node corresponding to the gate node thereof, and may be electrically connected to a source node or a drain node of the second transistor T2.

The second node N2 of the driving transistor T1 may be electrically connected to the first electrode 301 of the organic light emitting element OLED and may be a source node or a drain node.

The third node N3 of the driving transistor T1 may be the drain node or the source node as a node to which a driving voltage EVDD is applied, and may be electrically connected to a driving voltage line DVL for passing the driving voltage EVDD.

The driving transistor T1 and the second transistor T2 may be n-type transistors or p-type transistors.

The second transistor T2 may be electrically connected between a data line DL and the first node N1 of the driving transistor T1 and may be controlled by a scan signal SCAN that is delivered through a gate line and applied to the gate node of the first transistor T1.

The second transistor T2 may be turned on by the scan signal SCAN and apply a data voltage Vdata passed through the data line DL to the first node N1 of the driving transistor T1.

The storage capacitor Cst may be electrically connected between the first node N1 and the second node N2 of the driving transistor T1.

The storage capacitor Cst is an external capacitor intentionally designed to be located outside of the driving transistor T1, other than an internal storage, such as a parasitic capacitor (e.g., a Cgs, a Cgd) that presents between the first node N1 and the second node N2 of the driving transistor T1.

A third transistor T3 may be electrically connected between the second node N2 of the driving transistor T1 and a reference voltage line RVL. On-off operations of the third transistor T3 can be controlled by a second scan signal SCAN2 applied to the gate node of the second transistor T3.

A drain node or a source node of the third transistor T3 may be electrically connected to the reference voltage line RVL, and the source node or the drain node of the third transistor T3 may be electrically connected to the source node of the driving transistor T1.

The third transistor T3, for example, may be turned on in a period in which display driving is performed, and turned on in a period in which sensing driving is performed for sensing a characteristic value of the driving transistor T1 or a characteristic value of the organic light emitting diode (OLED).

The third transistor T3 may be turned on by the second scan signal SCAN2 and pass a reference voltage Vref applied to the reference voltage line RVL to the second node N2 of the driving transistor T1, according to corresponding driving timings (e.g., a display driving timing or an initial timing within a time period for the sensing driving).

The third transistor T3 may be turned on by the second scan signal SCAN2 and pass a voltage at the second node N2 of the driving transistor T1 to the reference voltage line RVL, according to corresponding driving timings (e.g., a sampling timing within the time period for the sensing driving).

In other words, the third transistor T3 can control a voltage status at the second node N2 of the driving transistor T1, or pass the voltage at the second node N2 of the driving transistor T1 to the reference voltage line RVL.

The reference voltage line RVL may be electrically connected to an analog-to-digital converter that senses a voltage of the reference voltage line RVL, converts the sensed voltage to a digital value, and then, outputs sensing data including the digital value.

The analog-to-digital converter may be included in the source driver integrated circuit SDIC implementing the data driving circuit DDR.

The sensing data output from the analog-to-digital converter may be used to sense a characteristic value of the driving transistor T1 (e.g., a threshold voltage, mobility, etc.) or a characteristic value of the organic light emitting diode (OLED) (e.g., a threshold voltage, etc.).

Each of the driving transistor T1, the second transistor T2, and the third transistor T3 may be an n-type transistor or a p-type transistor.

Meanwhile, the first scan signal SCAN1 and the second scan signal SCAN2 may be separate gate signals. In this instance, the first scan signal SCAN1 and the second scan signal SCAN2 respectively may be applied to the gate node of the second transistor T2 and the gate node of the third transistor T3 through different gate lines.

In some embodiment, the first scan signal SCAN1 and the second scan signal SCAN2 may be the same gate signal. In this instance, the first scan signal SCAN1 and the second scan signal SCAN2 may be commonly applied to the gate node of the second transistor T2 and the gate node of the third transistor T3 through the same gate line.

Figure 3:
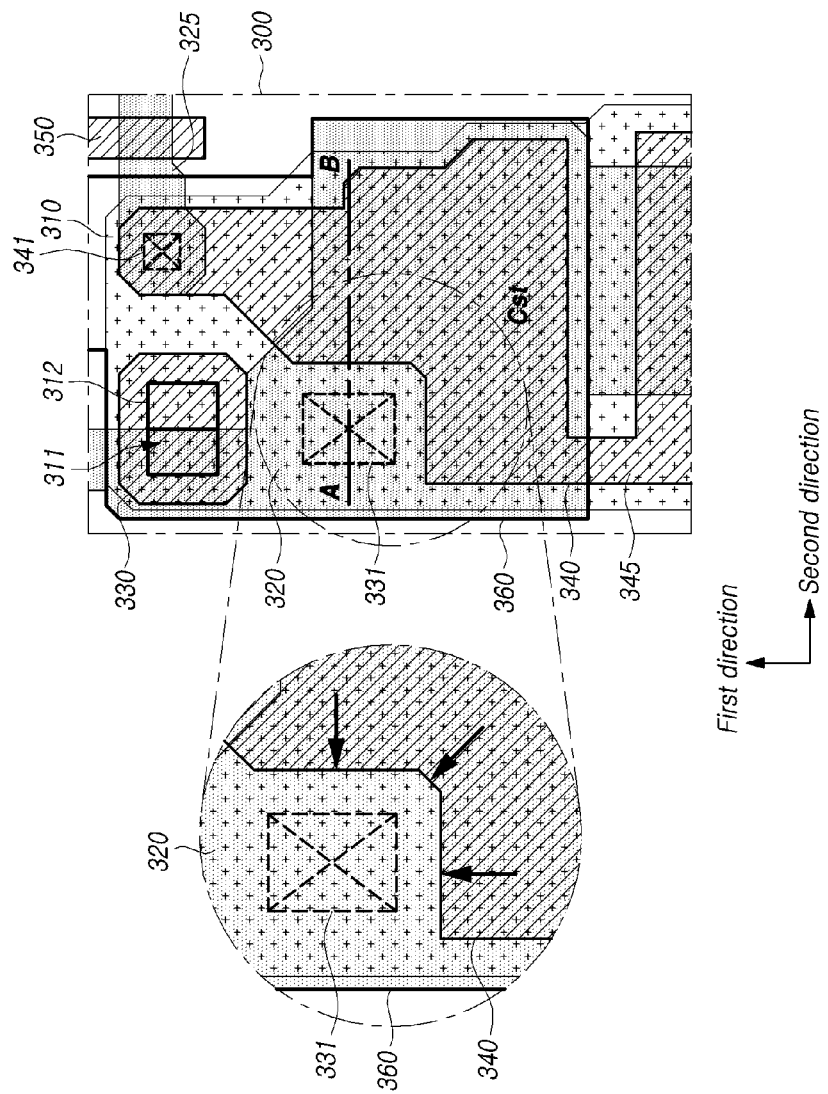
FIG. 3 is a plan view illustrating a partial area of a sub-pixel disposed in an active area of the organic light emitting display device according to one embodiment of the present disclosure.

It should be understood that the sub-pixel structure with three transistors (3T) and one capacitor (1C) shown in FIG. 3 is merely one example of possible sub-pixel structures for convenience of discussion, and embodiments of the present disclosure may be implemented in any of various structures, as desired. For example, the sub-pixel may further include at least one transistor and/or at least one capacitor.

In some embodiments, each of a plurality of sub-pixels may have the same structure, or some of the plurality of sub-pixels may have a different structure.

FIG. 3 is a plan view illustrating a partial area of a sub-pixel disposed in an active area of the organic light emitting display device according to one embodiment of the present disclosure.

Referring to FIG. 3, a first conductive layer 310, a first active layer 320, and a second conductive layer 330, a plate 340, and an organic light emitting element such as an organic light emitting diode may be disposed in at least one sub-pixel included in the organic light emitting display device 100 according to aspects of the present disclosure.

Further, a second active layer 325 disposed in the same layer as the first active layer 320 may be disposed in the at least one sub-pixel, and a gate electrode 350 of a transistor (e.g., the second transistor of FIG. 2) disposed in the same layer as the second conductive layer 330 and the plate 340 may be disposed in the at least one sub-pixel.

Specifically, the first conductive layer 310 may be disposed on a substrate 300.

The first active layer 320 may be disposed on or over the first conductive layer 310. A part of the first active layer 320 may overlap a part of the first conductive layer 310.

Further, the second active layer 325 that is disposed in the same layer as the first active layer 320 and spaced apart from the first active layer 320 may be disposed on or over the substrate 300 on which the first conductive layer 310 is disposed.

The second conductive layer 330 and the plate 340 may be disposed on or over the first active layer 320. The second conductive layer 330 and the plate 340 may be spaced apart from each other and disposed in the same layer.

Although not shown in FIG. 3, a buffer layer may be disposed between the first conductive layer 310 and the first active layer 320, and a first insulating film may be disposed between the first active layer 320 and the second conductive layer 330.

The buffer layer may include a contact hole 311 in an area corresponding to a part of an area in which the second conductive layer 330 is disposed, and the first insulating film may also include a second contact hole 312 in an area corresponding to a part of an area in which the second conductive layer 330 is disposed.

The first contact hole 311 of the buffer layer may overlap the second contact hole 312 of the first insulating film.

The first contact hole 311 of the buffer layer may overlap the second conductive layer 330 and overlap an area in which the first conductive layer 310 and the first active layer 320 do not overlap. The second contact hole 312 of the first insulating film may overlap the second conductive layer 330, and overlap an area in which the first conductive layer 310 and the first active layer 320 overlap while overlapping the second conductive layer 330, as well as the area in which the first conductive layer 310 and the first active layer 320 do not overlap.

Meanwhile, according to process conditions of forming the contact hole 311 of the buffer layer and the contact hole 312 of the first insulating film, the contact hole 311 of the buffer layer may also overlap an area in which the first conductive layer 310 and the first active layer 320 overlap while overlapping the second conductive layer 330. In this instance, an area of the contact hole 311 of the buffer layer overlapping the area in which the first conductive layer 310 and the first active layer 320 overlap while overlapping the second conductive layer 330 may be smaller than an area of the contact hole 312 of the first insulating film overlapping the area in which the first conductive layer 310 and the first active layer 320 overlap while overlapping the second conductive layer 330.

The contact hole 311 of the buffer layer may expose a part of an upper surface of the first conductive layer 310, and the contact hole 312 of the first insulating film may expose the part of the upper surface of the first conductive layer 310 and a part of an upper surface of the first active layer 320.

The second conductive layer 330 may contact the first conductive layer 310 through the contact hole 311 of the buffer layer and the contact hole 312 of the first insulating film. The second conductive layer 330 may contact the first active layer 320 through the contact hole 312 of the first insulating film.

The first active layer 320 may be electrically connected to the reference voltage line shown in FIG. 2.

A point at which the second conductive layer 330 contacts, and becomes electrically connected to, the first conductive layer 310 and the first active layer 320 may be included in an area corresponding to the second node N2 of FIG. 2.

The plate 340 spaced apart from the second conductive layer 330 may be disposed on or over the first active layer 320.

A part of the plate 340 may overlap a part of the first active layer 320 and a part of the first conductive layer 310.

Each of the first conductive layer 310, the first active layer 320, and the plate 340 may serve as an electrode of a storage capacitor Cst. The part of the first active layer 320 overlapping the plate 340 and the first conductive layer 320 may be a conductorized area or an area in which a conductive pattern is disposed. Herein, the "conductorized" "conductorizing", or the like may mean a situation in which a material becomes modified to act as a conductor.

That is, at least one sub-pixel disposed in the organic light emitting display device 100 may include at least one storage capacitor Cst, and the storage capacitor Cst may include, as electrodes thereof, the first conductive layer 310, the first active layer 320 and the plate 340.

The plate 340 may include at least one extension portion 345 protruding from one side of the plate 340.

A part of the extension portion 345 may overlap a part of the first active layer 320. The extension portion 345 may be the gate electrode (first gate electrode) of the driving transistor T1 illustrated in FIG. 2. The first active layer 320 may be an active layer of the driving transistor T1.

A second gate electrode 350 may be disposed over the substrate 300. The second gate electrode 350 may be disposed in the same layer as the second conductive layer 330 and the plate 340, and may be spaced apart from the second conductive layer 330 and the plate 340.

The second gate electrode 350 may overlap a part of the second active layer 325.

The second gate electrode 350 may be the gate electrode of the second transistor T2 illustrated in FIG. 2. The second active layer 325 may be an active layer of the second transistor T2.

Although not shown, the second gate electrode 350 may be electrically connected to a data line disposed over the substrate 300. On or over the substrate 300, a plurality of data lines may be disposed in a first direction, and a plurality of gate lines (or scan lines) may be disposed in a second direction crossing the first direction. However, embodiments of the present disclosure are not limited thereto. A plurality of signal lines may be arranged in various directions.

A part of the second active layer 325 may be electrically connected to a part of the plate 340 through a contact hole 341.

A point where the second active layer 325 and the plate 340 are electrically connected may correspond to the first node of FIG. 2.

The contact hole 341 located at the point where the second active layer 325 and the plate 340 contact each other may be disposed between the second conductive layer 330 and the second gate electrode 350 in a plan view.

However, embodiments of the present disclosure are not limited thereto. For example, when a size of the sub-pixel is reduced, the contact hole 341 located at the point where the second active layer 325 and the plate 340 contact may be disposed between the second conductive layer 330 and the extended portion 345 of the plate 340 in a plan view.

A third conductive layer 360 may be disposed on or over the second conductive layer 330, the plate 340, and the second gate electrode 350.

The third conductive layer 360 may be an anode electrode or a cathode electrode of an organic light emitting element.

The third conductive layer 360 may contact a part of an upper surface of the first active layer 320 through a contact hole 331 of the insulating films disposed between the third conductive layer 360 and the first active layer 320. An area of the first active layer 320 overlapping the contact hole 331 may be a conductorized area or an area in which a conductive pattern is arranged for enabling current to easily move. Through this, the third conductive layer 350 may be electrically connected to the second conductive layer 320.

The contact hole 331 of the insulating films disposed between the third conductive layer 360 and the first active layer 320 may be spaced apart from the contact hole 311 of the buffer layer and the contact hole 312 of the first insulating film.

Further, the contact hole 331 of the insulating films disposed between the third conductive layer 360 and the first active layer 320 may be spaced apart from the plate 340 as well.

A point at which the third conductive layer 360 and the first active layer 320 are electrically connected may be included in the area corresponding to the second node N2 of FIG. 2. As described above, the point at which the second conductive layer 330 contacts, and becomes electrically connected to, the first conductive layer 310 and the first active layer 320 may be included in the area corresponding to the second node N2 of FIG. 2.

As described above, the second node N2 of the driving transistor may include a point electrically connected to an electrode of an organic light emitting element.

To do this, in an area corresponding to the second node N2 of the driving transistor, when the second conductive layer 330 and the third conductive layer 360 are connected by allowing the second conductive layer 330 to extend up to an area in which the contact hole 331 of the insulating films disposed between the third conductive layer 360 and the first active layer 320 is disposed, a space is needed between the second conductive layer 330 and the plate 340 to prevent or at least reduce a short connection between the second conductive layer 330 and the plate 340 disposed in the same layer.

Further, it is needed to consider a process margin so that the second conductive layer 330 can be located in the contact hole 331 of the insulating films disposed between the third conductive layer 360 and the first active layer 320. Thus, the second conductive layer 330 may be disposed in the contact hole 331 of the insulating films disposed between the third conductive layer 360 and the first active layer 320, and further extent to be disposed on at least a part of upper surfaces of the insulating films including the contact hole 331 in order to ensure such a process margin.

That is, as the second conductive layer 330 is disposed inside of the contact hole 331 and further extends up to the at least a part of the upper surfaces of the insulating films adjacent to the contact hole 331, and the second conductive layer 330 and the plate 340 are required to be spaced apart, therefore, a size of the plate 340 disposed in the sub-pixel may be reduced due to the second conductive layer 330.

As the size of the plate 340 is reduced, the capacity of the storage capacitor Cst may also be reduced.

In contrast, the organic light emitting display device 100 according to embodiments described herein can have a structure in which the second conductive layer 330 does not overlap the contact hole 331 of the insulating films disposed between the third conductive layer 360 and the first active layer 320, and overlaps the contact hole 311 of the buffer layer and the contact hole 312 of the first insulating film. Further, as the third conductive layer 360 contacts the first active layer 320 included in the second node N2 of the driving transistor through the contact hole 331 of the insulating films disposed between the third conductive layer 360 and the first active layer 320, the area of the plate 340 can be increased.

In other words, as the contact hole 331 of the insulating films disposed between the third conductive layer 360 and the first active layer 320 does not overlap the second conductive layer 330, a distance between the second conductive layer 330 and the plates 340 can be sufficiently obtained, and it is therefore not necessary to reduce the size of the plate 340 to obtain the distance between the second conductive layer 330 and the plates 340.

In this situation, as the plate 340 may not overlap the contact hole 331, a margin (separation distance) may be needed for allowing the plate 340 to be spaced apart from the contact hole 331. However, the margin between the plate 340 and the contact hole 331 may be smaller than a margin between the plate 340 and the second conductive layer 330 disposed inside of the contact hole 331 and on the at least a part of the upper surfaces of the insulating films adjacent to the contact hole 331.

Accordingly, the area of the plate 340 disposed in the sub-pixel of the organic light emitting display device 100 according to embodiments described herein can be increased when compared with the structure in which the second conductive layer 330 is disposed in the second conductive layer 330 in the contact hole 331 for contacting the second conductive layer 330, and the second conductive layer 330 extends up to at least a part of the upper surfaces of the insulating films including the contact hole 331.

Meanwhile, in a situation where the organic light emitting display device 100 is required to have high resolution, a high-capacity storage capacitor Cst is needed, and to implement such a high-capacity storage capacitor Cst, it is required to increase an area of at least one electrode of the storage capacitor Cst disposed in the sub-pixel.

However, an area of each sub-pixel is limited, and if the area of the electrode of the storage capacitor (Cst) is increased, an area of a corresponding light emitting area included in the sub-pixel may be reduced. This can lead the luminance of the sub-pixel to reduce, and after-images to occur when the associated panel is driven.

In contrast, as the organic light emitting display device 100 according to embodiments described herein can have the structure in which the second conductive layer 330 does not overlap the contact hole 331 of the insulating films disposed between the third conductive layer 360 and the first active layer 320, and overlaps the contact hole 311 of the buffer layer and the contact hole 312 of the first insulating film, an area occupied by the area of the second conductive layer 330 can be reduced, and a size of the plate 340 required to be spaced apart from the second conductive layer 330 can be increased. In other words, as the area of the electrode of the storage capacitor Cst can be increased without reducing the area of the light emitting area, it is therefore possible to implement the organic light emitting display device 100 having high luminance and high resolution characteristics and preventing after-images.

Further, in the case of the organic light emitting display device 100 required to have high luminance, the size of the non-light emitting area in which the storage capacitor (Cst) and a plurality of transistors are disposed is needed to be reduced, and the size of the light emitting area is needed to be increased. In the organic light emitting display device according to embodiments described herein, the organic light emitting display device 100 having high luminance can be implemented by designing the non-light emitting area to have a relatively small size (in this situation, increasing the size of the plate 340 may not be needed) and the light emitting area to have a relatively large size.

As described above, the third conductive layer 360 of the organic light emitting display device 100 according to embodiments described herein may not contact the second conductive layer 330 at the second node of the driving transistor, and contact the first active layer 320. In this regard, the arrangement structure of the third conductive layer 360 and the second conductive layer 330 will be described in detail below.

Figure 4:
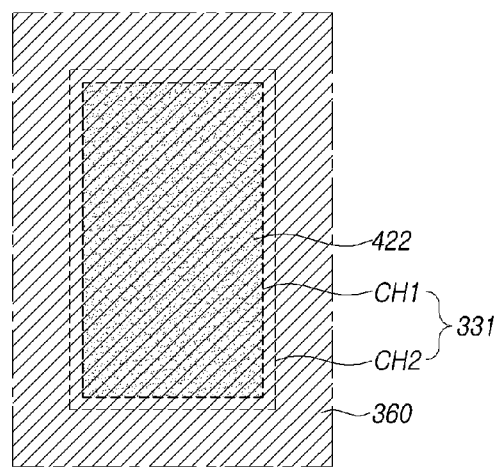
FIG. 4 schematically illustrates an area in which a first active layer and a third conductive layer contact in one embodiment in the display device according to one embodiment of the present disclosure.
Figure 5:
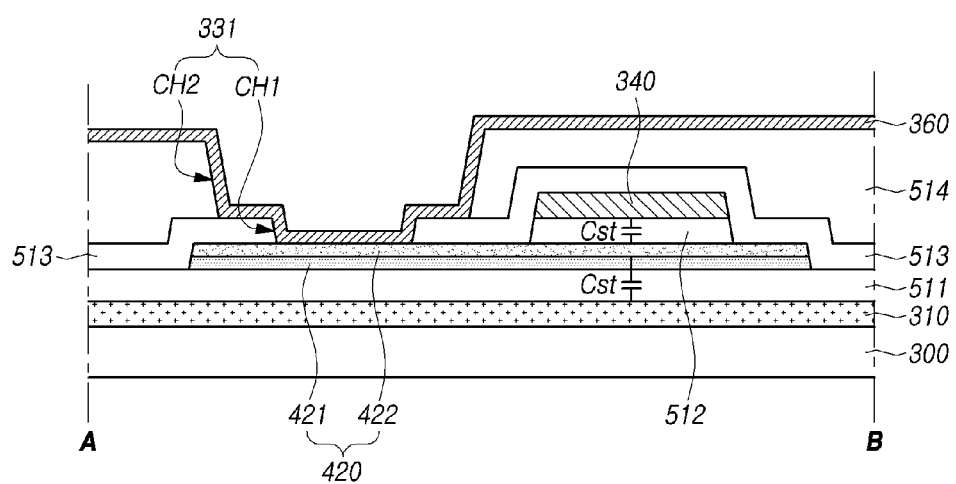
FIG. 5 is a cross-sectional view taken along with line A-B of FIG. 3, and illustrates a structure of the display panel including the structure where the first active layer and the third conductive layer contacts as illustrated in FIG. 4 according to one embodiment of the present disclosure.

FIG. 4 schematically illustrates an area in which a first active layer and a third conductive layer contact in one embodiment in the display device according to one embodiment of the present disclosure. FIG. 5 is a cross-sectional view taken along with line A-B of FIG. 3, and illustrates a structure of the display panel including the structure where the first active layer and the third conductive layer contacts as illustrated in FIG. 4 according to one embodiment.

In the following description, some configurations, effects etc. of the embodiments or examples discussed above may not be repeatedly described for convenience of description. Further, in the following description, like reference numerals will be used for configurations or elements equal to those of embodiments or examples described above.

Referring to FIG. 4, in the organic light emitting display device 100, a part of an upper surface of a first active layer may be exposed through a contact hole 331. The upper surface of the first active layer exposed by the contact hole 331 may contact a third conductive layer 360.

The first active layer may include an active pattern and at least one layer of a conductive pattern 422 disposed on the active pattern.

The upper surface of the first active layer exposed by the contact hole 331 may be an upper surface of the conductive pattern 422. The contact hole 331 of FIG. 4 may include contact holes CH1 and CH2 of insulating films disposed between the first active layer and the third conductive layer 360.

The third conductive layer 360 may contact a part of the upper surface of the conductive pattern 422 through the contact hole 331.

Specifically, referring to FIG. 5, the first conductive layer 310 may be disposed on the substrate 300.

The first conductive layer 310 may include a conductive material capable of absorbing or reflecting light. For example, the first conductive layer 310 may include any one of either a metal such as aluminum (Al), gold (Au), silver (Ag), copper (Cu), tungsten (W), molybdenum (Mo), chromium (Cr), tantalum (Ta), titanium (Ti), or the like, or an alloy thereof. However, embodiments of the present disclosure are not limited thereto.

The first conductive layer 310 may be disposed under the first active layer 420 and may serve to protect the first active layer 420 from external factors (e.g., light).

In FIG. 5, the first conductive layer 310 is illustrated as having a single layer structure. However, embodiments of the present disclosure are not limited thereto. For example, the first conductive layer 310 may have a multilayer structure.

The buffer layer 511 may be disposed over the substrate on which the first conductive layer 310 is disposed.

The buffer layer 411 may include an inorganic insulating material such as silicon oxide (SiOx), silicon nitride (SiNx), or silicon oxynitride (SiON). However, embodiments of the present disclosure are not limited thereto.

In FIG. 4, the buffer layer 310 is represented as having a single layer structure. However, embodiments of the present disclosure are not limited thereto. For example, the buffer layer 310 may have a multilayer structure.

The first active layer 420 may be disposed on a part of an upper surface of the buffer layer 310.

The first active layer 420 may include the active pattern 421 disposed on the buffer layer 310 and the conductive pattern 422 disposed on the active pattern 421.

The active pattern 421 may be formed of an oxide semiconductor. An material included in the first active layer 320 may be a metal oxide semiconductor, and may be formed of i) an oxide of a metal such as molybdenum (Mo), zinc (Zn), indium (In), gallium (Ga), tin (Sn), titanium (Ti), or the like, or ii) an combination of a metal such as molybdenum (Mo), zinc (Zn), indium (In), gallium (Ga), tin (Sn), titanium (Ti), or the like and an oxide of molybdenum (Mo), zinc (Zn), indium (In), gallium (Ga), tin (Sn), titanium (Ti), or the like.

For example, the active pattern 421 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). However, embodiments of the present disclosure are not limited thereto.

The conductive pattern 422 may include any one of either a metal such as aluminum (Al), gold (Au), silver (Ag), copper (Cu), tungsten (W), molybdenum (Mo), chromium (Cr), tantalum (Ta), titanium (Ti), or the like, or an alloy thereof; however, embodiments of the present disclosure are not limited thereto. For example, the conductive pattern 622 may include an alloy of molybdenum (Mo) and titanium (Ti). However, embodiments of the present disclosure are not limited thereto.

In FIG. 5, an area in which the active pattern 421 overlaps the conductive pattern 422 may be a non-conductorized area.

Although FIG. 5 illustrates that the first active layer 420 has the structure including the active pattern 421 and the conductive pattern 422, embodiments of the present disclosure are not limited thereto. For example, the second active layer 325 illustrated in FIG. 3 may also include an active pattern and a conductive pattern.

The conductive pattern 422 may be disposed on the active pattern 421 to help electrical connection with other components. Further, the conductive pattern 422 may serve as a mask in a conductorizing process of the active pattern 421, and thus, serve to help the conductorizing process of the active pattern 421 without an additional mask.

A first insulating film 512 may be disposed on a part of the upper surface of the first active layer 420.

The first insulating film 512 may include an inorganic insulating material such as silicon oxide (SiOx), silicon nitride (SiNx), or silicon oxynitride (SiON). However, embodiments of the present disclosure are not limited thereto.

The plate 340 may be disposed on the first insulating film 512.

The plate 340 may include any one of either a metal such as aluminum (Al), gold (Au), silver (Ag), copper (Cu), tungsten (W), molybdenum (Mo), chromium (Cr), tantalum (Ta), titanium (Ti), or the like, or an alloy thereof. However, embodiments of the present disclosure are not limited thereto.

Here, the first conductive layer 310, the conductive pattern 422 of the first active layer 420, and the plate 340 may overlap one another. Each of the first conductive layer 310, the conductive pattern 422 of the first active layer 420, and the plate 340 may serve as an electrode of the storage capacitor Cst.

As a result, as the first active layer 420 includes the conductive pattern 422, the storage capacitor Cst is allowed to include three electrodes, and thereby, the capacity of the storage capacitor Cst can be increased.

A second insulating film 513 may be disposed over the substrate 300 over which the plate 340 is disposed.

The second insulating film 513 may include an inorganic insulating material such as silicon oxide (SiOx), silicon nitride (SiNx), or silicon oxynitride (SiON). However, embodiments of the present disclosure are not limited thereto.

The second insulating film 513 may cover the plate 340 and the first insulating film 512.

The second insulating film 513 may include a first contact hole CH1 exposing a part of the upper surface of the first active layer 420. Specifically, the second insulating film 513 may expose a part of the upper surface of the conductive pattern 422 of the first active layer 420 through the first contact hole CH1. In other words, the second insulating film 513 may include an area that does not overlap the conductive pattern 422 due to the first contact hole CH1.

A third insulating film 514 may be disposed on the second insulating film 513.

The third insulating film 514 may include an organic insulating material. However, embodiments of the present disclosure are not limited thereto.

The third insulating film 514 may include a second contact hole CH2 overlapping the first contact hole CH1 of the second insulating film 513. The third insulating film 514 may expose a part of the upper surface of the conductive pattern 422 of the first active layer 420 through the second contact hole CH2.

As illustrated in FIGS. 4 and 5, an opening size of the first contact hole CH1 and an opening size of the second contact hole CH2 may be different. However, embodiments of the present disclosure are not limited thereto. For example, the opening size of the first contact hole CH1 and the opening size of the second contact hole CH2 may be the same. These opening sizes may be the maximum lengths of respective contact holes in the cutting direction along line A-B illustrated in FIG. 3. Here, the cutting direction along line illustrated in FIG. 3 may be a second direction of FIG. 3 (e.g., a direction in which the gate line GL runs).

The first contact hole CH1 of the second insulating film 513 and the second contact hole CH2 of the third insulating film 514 illustrated in FIGS. 4 and 5 may be formed through a wet etching process in which patterning is performed using an etching solution. Even when the wet etching is performed for the second insulating film 513 and the third insulating film 514, as the conductive pattern 422 including a metal or a metal alloy is disposed under the second insulating film 513, therefore, the first active layer 420 may not be damaged by the etching solution. That is, as the first active layer 420 includes the conductive pattern 422, process stability may be improved.

The third conductive layer 360 may be disposed on the third insulating film 514.

The third conductive layer 360 may include a transparent conductive material, for example, at least one of Indium Tin Oxide (ITO), Indium Zinc Oxide (IZO), or Indium Gallium Zinc Oxide (IGZO). However, embodiments of the present disclosure are not limited thereto.

The third conductive layer 360 may contact an upper surface of the conductive pattern 422 of the first active layer 420 through the first contact hole CH1 of the second insulating film 513 and the second contact hole CH2 of the third insulating film 514.

Accordingly, in an area corresponding to the second node N2 of the driving transistor, the third conductive layer 360 may be electrically connected to the first active layer 320.

Further, as illustrated in FIGS. 4 and 5, as the second conductive layer 330 of FIG. 3 disposed in the same layer as the plate 340 does not overlap the first contact hole CH1 of the second insulating film 513 and the second contact hole CH2 of the third insulating film 514, the plate 340 may be extended up to an area adjacent to the first and second contact holes CH1 and CH2, and thereby, the capacity of the storage capacitor can be increased.

The organic light emitting display device 100 according to aspects of the present disclosure may include an arrangement structure of the third conductive layer 360 and the second conductive layer 330 according to other embodiments. Such embodiments will be discussed below.

Figure 6:
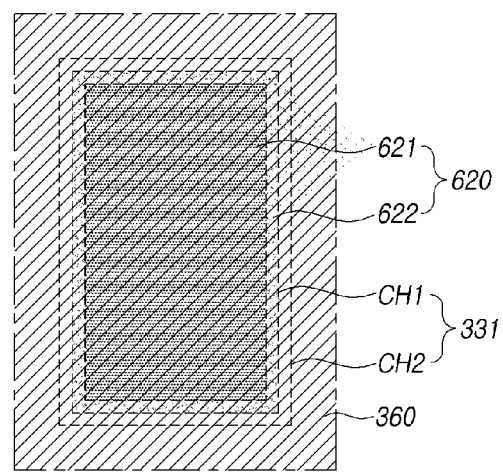
FIG. 6 schematically illustrates an area in which a first active layer and a third conductive layer contact in another embodiment in the display device according to one embodiment of the present disclosure.
Figure 7:
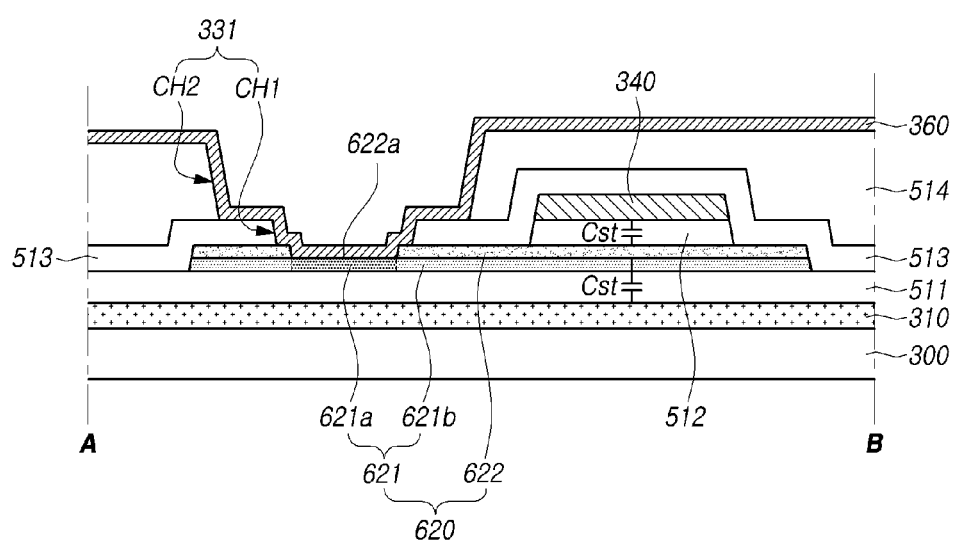
FIG. 7 is a cross-sectional view taken along with line A-B of FIG. 3, and illustrates a structure of the display panel including the structure where the first active layer and the third conductive layer contacts as illustrated in FIG. 6 according to one embodiment of the present disclosure.

FIG. 6 schematically illustrates an area in which a first active layer and a third conductive layer contact in another embodiment in the display device according to one embodiment of the present disclosure. FIG. 7 is a cross-sectional view taken along with line A-B of FIG. 3, and illustrates a structure of the display panel including the structure where the first active layer and the third conductive layer contacts as illustrated in FIG. 6 according to one embodiment of the present disclosure.

In the following description, some configurations, effects etc. of the embodiments or examples discussed above may not be repeatedly described for convenience of description. Further, in the following description, like reference numerals will be used for configurations or elements equal to those of embodiments or examples described above.

Referring to FIG. 6, in some embodiments, in the organic light emitting display device 100 according to aspects of the present disclosure, a part of an upper surface of each of an active pattern 621 and a conductive pattern 622 of a first active layer 620 may be exposed through a contact hole 331. The upper surface of each of the active pattern 621 and the conductive pattern 622 of the first active layer 620 exposed through the contact hole 331 may contact the third conductive layer 360.

The contact hole 331 exposing the part of the upper surface of each of the active pattern 621 and the conductive pattern 622 of the first active layer 620 may be contact holes CH1 and CH2 of insulating films disposed between the first active layer 620 and the third conductive layer 360.

A part of an upper surface of the active pattern 621 of the first active layer 620 may be exposed through the conductive pattern 622 of the first active layer 620. That is, while the conductive pattern 622 is disposed on the active pattern 621, the active pattern 621 may include an area that does not overlap the conductive pattern 622.

Here, the area of the active pattern 621 that does not overlap the conductive pattern 622 and overlaps the contact hole 331 may be a conductorized area.

As the conductive pattern 622 exposes the part of the upper surface of the active pattern 621, and the contact hole 331 exposes the part of the upper surface of each of the conductive pattern 622 and the active pattern 621, the third conductive layer 360 may be electrically connected to each of the active pattern 621 and the conductive pattern 622.

Specifically, referring to FIG. 7, the first conductive layer 310 and the buffer layer 511 may be disposed on or over the substrate 300.

The first active layer 620 may be disposed on the buffer layer 511.

The active pattern 621 of the first active layer 620 may be disposed on a part of the upper surface of the buffer layer 511.

The conductive pattern 622 of the first active layer 620 is disposed on the active pattern 621 and may include a first opening 622a exposing a part of the upper surface of the active pattern 621. In other words, the conductive pattern 622 may include an area that does not overlap the active pattern 621.

The first insulating film 512 may be disposed on a part of the upper surface of the conductive pattern 622 of the first active layer 620, and the plate 340 may be disposed on the first insulating film 512

The first conductive layer 310, the conductive pattern 622 of the first active layer 620, and the plate 340 may overlap one another. Each of the first conductive layer 310, the conductive pattern 622 of the first active layer 620, and the plate 340 may serve as an electrode of the storage capacitor Cst.

The second insulating film 513 may be disposed over the substrate 300 over which the plate 340 is disposed.

The second insulating film 513 may include the first contact hole CH1 exposing the part of the upper surface of the first active layer 620. Specifically, the second insulating film 513 may expose the part of the upper surface of the active pattern 621 and the part of the upper surface of the conductive pattern 622 of the first active layer 620 through the first contact hole CH1.

The first contact hole CH1 of the second insulating film 513 may overlap the first opening 622a exposing the part of the upper surface of the active pattern 621 of the first active layer 620. A size of the first contact hole CH1 of the second insulating film 513 may be greater than a size of the first opening 622a of the conductive pattern 622. Accordingly, the first contact hole CH1 of the second insulating film 513 may expose a part of the upper surface of the active pattern 621 while exposing a part of the upper surface of the conductive pattern 622.

These sizes of the contact holes may be the maximum lengths of respective contact holes in the cutting direction along line A-B illustrated in FIG. 3. Here, the cutting direction along line A-B illustrated in FIG. 3 may be the second direction of FIG. 3 (e.g., the direction in which the gate line GL runs).

Although not shown in the drawing, a size of the first contact hole CH1 of the second insulating film 513 in the first direction (for example, the direction in which the data line runs) of FIG. 3 may be greater than a size of the first opening 622a of the conductive pattern 622.

The first contact hole CH1 of the second insulating film 513 illustrated in FIGS. 6 and 7 may be formed through a dry etching process using plasma. In some embodiments, the second contact hole CH2 of the third insulating film 514 may also be formed through the dry etching process.

Further, a part of the conductive pattern 622 of the first active layer 620 may be removed by plasma as shown in FIGS. 6 and 7 according to the dry etching process conditions. An area of the active pattern 621 located in an area corresponding to the area of the conductive pattern 622 removed by the plasma may become conductorized.

In other words, the active pattern 621 may include the conductive area (i.e., a conductorized area) 621a located in an area corresponding to the first opening 622a of the conductive pattern 622.

The conductive area 621a of the active pattern 621 may be an area conductorized by plasma. On the other hand, when the energy of the plasma is low, only the upper surface of the active pattern 621 may become conductorized, and when the energy of the plasma is high, even a rear surface of the active pattern 621 may become conductorized, and even a partial area of the active pattern 621 overlapping the conductive pattern 6221 may become conductorized.

That is, when the first contact hole CH1 of the second insulating film 513 is formed through the dry etching process, as shown in FIG. 7, the active pattern 621 of the first active layer 620 may include a conductive area (i.e., conductorized area) 621a.

Thus, the active pattern 621 may include the conductive area 621a. Further, the active pattern 621 may include a non-conductive area 621b. The non-conductive area 621b of the active pattern 621 may be an area overlapping the conductive pattern 622. However, embodiments of the present disclosure are not limited thereto. For example, when the energy of the plasma is high, as a size of the conductive area 621a of the active pattern 621 increases, thus, a part of the conductive area 621a may overlap the conductive pattern 622.

A part of the conductive area 621a of the active pattern 621 may contact the conductive pattern 622. Specifically, the conductive pattern 622 of the first active layer 620 may contact the conductive area 621a at a boundary between the conductive area 621a and the non-conducting area 621b of the active pattern 621.

However, embodiments of the present disclosure are not limited thereto. For example, when a part of the conductive area 621a of the active pattern 621 overlaps the conductive pattern 622, the conductive pattern 622 may contact the conductive area 621a at the boundary between the conductive area 621a and the non-conducting area 621b of the active pattern 621 and further contact a part of the upper surface of the conductive area 621a.

The third insulating film 514 may be disposed on the second insulating film 513.

The third insulating film 514 may include the second contact hole CH2 overlapping the first contact hole CH1 of the second insulating film 513. Specifically, the third insulating film 514 may expose a part of the upper surface of the active pattern 621 and a part of the upper surface of the conductive pattern 622 of the first active layer 620 through the second contact hole CH2.

The third conductive layer 360 may be disposed on the third insulating film 514.

The third conductive layer 360 may contact each of the active patterns 621 and the conductive pattern 622 of the first active layer 320 through the first contact hole CH1 of the second insulating film 513 and the second contact hole CH2 of the third insulating film 514.

Specifically, the third conductive layer 360 may contact the part of the upper surface of the conductive pattern 622 of the first active layer 620, and contact a side surface of the conductive pattern 622 resulting from the first opening 622a of the conductive pattern 622. Further, the third conductive layer 360 may contact the conductive area 621a of the active pattern 621 overlapping the first opening 622a of the conductive pattern 622.

Accordingly, the third conductive layer 360 may be electrically connected to the conductive pattern 622 and the active pattern 621 of the first active layer 620. In other words, in an area corresponding to the second node N2 of the driving transistor, the third conductive layer 360 may be electrically connected to the first active layer 620.

Figure 8:
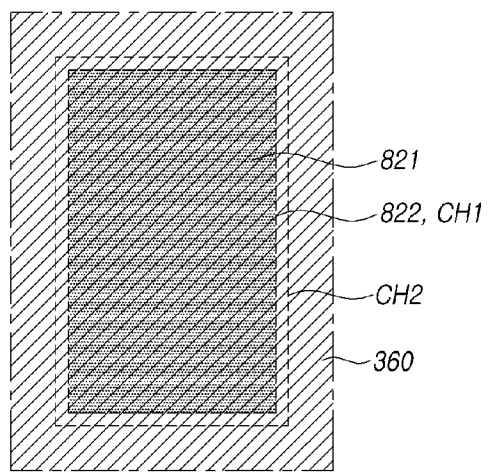
FIG. 8 schematically illustrates an area in which a first active layer and a third conductive layer contact in further another embodiment in the display device according to one embodiment of the present disclosure.
Figure 9:
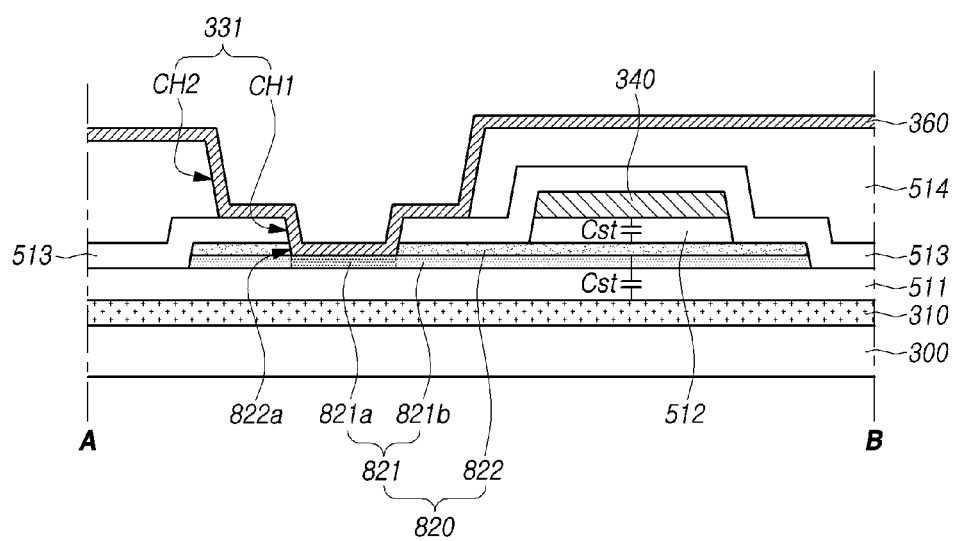
FIG. 9 is a cross-sectional view taken along with line A-B of FIG. 3, and illustrates a structure of the display panel including the structure where the first active layer and the third conductive layer contacts as illustrated in FIG. 8 according to one embodiment of the present disclosure.

Next, in some embodiments, referring to FIGS. 8 and 9, discussions will be conducted on structures different from the structures described above.

FIG. 8 schematically illustrates an area in which a first active layer and a third conductive layer contact in further another embodiment in the display device according to one embodiment of the present disclosure. FIG. 9 is a cross-sectional view taken along with line A-B of FIG. 3, and illustrates a structure of the display panel including the structure where the first active layer and the third conductive layer contacts as illustrated in FIG. 8 according to one embodiment of the present disclosure.

In the following description, some configurations, effects etc. of the embodiments or examples discussed above may not be repeatedly described for convenience of description. Further, in the following description, like reference numerals will be used for configurations or elements equal to those of embodiments or examples described above.

Referring to FIG. 8, in the organic light emitting display device 100 according to aspects of the present disclosure, a part of an upper surface of an active pattern 821 of the first active layer may be exposed by a first contact hole CH1 of a second insulating film, a conductive pattern 822 of the first active layer and a second contact hole CH2 of a third insulating film. A part of the upper surface of the active pattern 821 of the first active layer may contact the third conductive layer 360.

Here, the area in which the active pattern 821 of the first active layer contacts the third conductive layer 360 may be a conductorized area.

Specifically, referring to FIG. 9, the first active layer 820 may be disposed on or over the substrate 300 and the buffer layer.

The conductive pattern 822 of the first active layer 820 is disposed on the active pattern 821 and may include a first opening 822a exposing a part of the upper surface of the active pattern 821. In other words, the conductive pattern 822 may include an area that does not overlap the active pattern 821.

The first insulating film 512 may be disposed on a part of the upper surface of the conductive pattern 822 of the first active layer 820, and the plate 340 may be disposed on the first insulating film 512.

The first conductive layer 310, the conductive pattern 822 of the first active layer 820, and the plate 340 are disposed to overlap one another. Further, each of the first conductive layer 310, the conductive pattern 822 of the first active layer 820, and the plate 340 may serve as an electrode of a storage capacitor Cst.

The second insulating film 513 may be disposed over the substrate 300 over which the plate 340 is disposed.

The second insulating film 513 may include the first contact hole CH1 exposing a part of the upper surface of the active pattern 821 of the first active layer 821.

The first contact hole CH1 of the second insulating film 513 may overlap the first opening 822a of the conductive pattern 822 of the first active layer 820. Further, a size of the first contact hole CH1 of the second insulating film 513 and a size of the first opening 822a of the conductive pattern 822 may correspond to each other.

Accordingly, a part of the upper surface of the active pattern 821 of the first active layer 820 may be exposed by the first contact hole CH1 of the second insulating film 513 and the first opening 822a of the conductive pattern 822.

The first contact hole CH1 of the second insulating film 513 illustrated in FIGS. 8 and 9 may be formed through a dry etching process using plasma.

In the process of forming the first contact hole CH1 in the second insulating film 513, even a part of the conductive pattern 822 of the first active layer 820 may be removed, and thus, the first opening 822a may include the removed part. A size of the first opening 822a of the conductive pattern 822 may correspond to a size of the first contact hole CH1 of the second insulating film 513. In other words, the size of the first opening 822a of the conductive pattern 822 and the size of the first contact hole CH1 of the second insulating film 513 in the first and second directions shown in FIG. 3 may be the same as each other.

Further, in an area in which the first contact hole CH1 in the second insulating film 513 and the first opening 822a of the conductive pattern 822 overlap, the active pattern 821 may include a conductive area 821a.

The conductive area 821a of the active pattern 821 may be an area conductorized by plasma. A non-conductive area 821b of the active pattern 821 may be an area in which conductorizing have not been developed because plasma could not affect the active pattern 821 (for example, the area covered by the conductive pattern 822).

That is, when the first contact hole CH1 of the second insulating film 513 is formed through the dry etching process, as shown in FIG. 9, the active pattern 821 of the first active layer 820 may include the conductive area 821a and the non-conductive area 821b.

Specifically, the conductive pattern 822 of the first active layer 820 may contact the conductive area 821a at a boundary between the conductive area 821a and the non-conducting area 821b of the active pattern 821. However, embodiments of the present disclosure are not limited thereto. For example, in the process of forming the first contact hole CH1 in the second insulating film 513, when the energy of the plasma is high, and a part of the conductive region 821a of the active pattern 821 is formed to overlap the conductive pattern 822, the conductive pattern 822 may contact the conductive area 821a at the boundary between the conductive area 821a and the non-conducting area 821b of the active pattern 821 and further contact a part of the upper surface of the conductive area 821a.

The third insulating film 514 may be disposed on the second insulating film 513.

The third insulating film 514 may include the second contact hole CH2 overlapping the first contact hole CH1 of the second insulating film 513. The third insulating film 514 may expose a part of the upper surface of the active pattern 821 of the first active layer 320 through the second contact hole CH2.

The third conductive layer 360 may be disposed on the third insulating film 514.

The third conductive layer 360 may contact each of the active patterns 821 and the conductive pattern 822 of the first active layer 820 through the first contact hole CH1 of the second insulating film 513 and the second contact hole CH2 of the third insulating film 514.

Specifically, the third conductive layer 360 may contact a side surface of the conductive pattern 822 resulting from the first opening 822a of the conductive pattern 822 of the first active layer 820. Further, the third conductive layer 360 may contact the conductive area 821a of the active pattern 821 overlapping the first opening 822a of the conductive pattern 822.

Accordingly, in an area corresponding to the second node N2 of the driving transistor, the third conductive layer 360 may be electrically connected to the first active layer 820.

Figure 10:
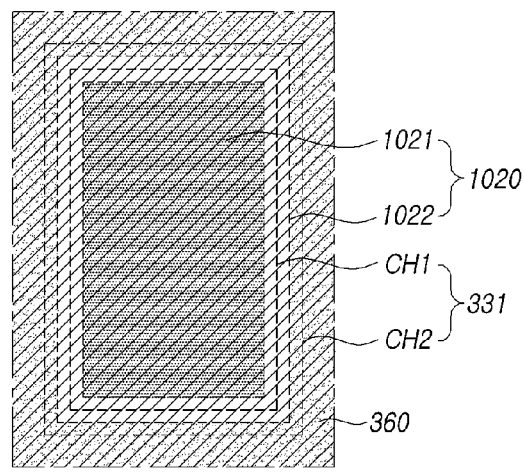
FIG. 10 schematically illustrates an area in which a first active layer and a third conductive layer contact in an area corresponding to a second node of a driving transistor in yet another embodiment in the display device according to one embodiment of the present disclosure.
Figure 11:
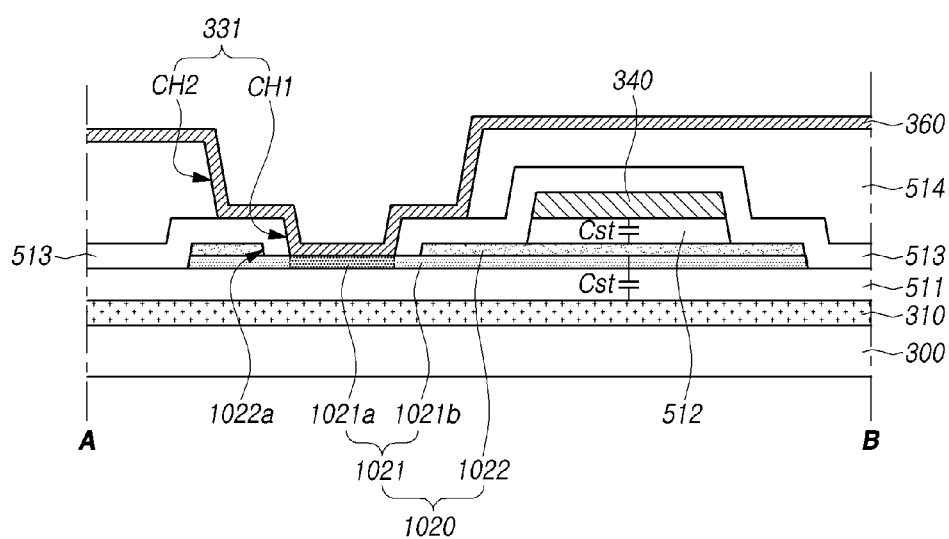
FIG. 11 is a cross-sectional view taken along with line A-B of FIG. 3, and illustrates a structure of the display panel including the structure where the first active layer and the third conductive layer contacts as illustrated in FIG. 10 according to one embodiment of the present disclosure.

Next, in some embodiments, referring to FIGS. 10 and 11, discussions will be conducted on structures different from the structures described above.

FIG. 10 schematically illustrates an area in which a first active layer and a third conductive layer contact in an area corresponding to a second node of a driving transistor in yet another embodiment in the display device according to one embodiment of the present disclosure. FIG. 11 is a cross-sectional view taken along with line A-B of FIG. 3, and illustrates a structure of the display panel including the structure where the first active layer and the third conductive layer contacts as illustrated in FIG. 10 according to one embodiment of the present disclosure.

In the following description, some configurations, effects etc. of the embodiments or examples discussed above may not be repeatedly described for convenience of description. Further, in the following description, like reference numerals will be used for configurations or elements equal to those of embodiments or examples described above.

Referring to FIG. 10, in the organic light emitting display device 100 according to aspects of the present disclosure, a part of the top surface of the active pattern 1021 of the first active layer 1020 may be exposed by a conductive pattern 1022 of the first active layer, a first contact hole CH1 of a second insulating film, and a second contact hole CH2 of a third insulating film.

Specifically, a part of an upper surface of the active pattern 1021 of the first active layer 1020 may be exposed through an opening of the conductive pattern 1022 of the first active layer 1020.

Further, the second insulating film disposed on the conductive pattern 1022 may include the first contact hole CH1 exposing a part of the upper surface of the active pattern 1021 of the first active layer 1020, and the second insulating film may be disposed to surround the conductive pattern 1022 of the active layer 320.

Accordingly, an area of the opening of the conductive pattern 1022 may be greater than an area of the first contact hole CH1 of the second insulating film in a plan view.

A part of the upper surface of the active pattern 1021 of the first active layer 1020 may contact the third conductive layer 360, and the area in which the active pattern 1021 of the first active layer 1020 contacts the third conductive layer 360 may be a conductorized area.

Specifically, referring to FIG. 11, the conductive pattern 1022 of the first active layer 1020 is disposed on the active pattern 1021 and may include a first opening 1022a exposing a part of the upper surface of the active pattern 1021. In other words, the conductive pattern 1022 may include an area that does not overlap the active pattern 1021.

The first insulating film 512 may be disposed on a part of the upper surface of the conductive pattern 1022 of the first active layer 1020, and the plate 340 may be disposed on the first insulating film 512

The first conductive layer 310, the conductive pattern 1022 of the first active layer 1020, and the plate 340 are disposed to overlap one another. Further, each of the first conductive layer 310, the conductive pattern 822 of the first active layer 820, and the plate 340 may serve as an electrode of a storage capacitor Cst.

The second insulating film 513 may be disposed over the substrate 300 over which the plate 340 is disposed.

The second insulating film 513 may include the first contact hole CH1 exposing a part of the upper surface of the active pattern 1021 of the first active layer 820.

The first contact hole CH1 of the second insulating film 513 may overlap the first opening 1022a of the conductive pattern 1022 of the first active layer 1020. A size of the first contact hole CH1 of the second insulating film 513 may be smaller than a size of the first opening 1022a of the conductive pattern 1022.

Accordingly, the second insulating film 513 may be disposed to expose a part of the upper surface of the active pattern 1021 of the first active layer 1020 through the first contact hole CH1, and may be disposed to surround the upper surface and a side surface of the conductive pattern 1022 of the first active layer 1020.

The first contact hole CH1 of the second insulating film 513 illustrated in FIGS. 10 and 11 may be formed through the dry etching process using plasma.

Further, in the process of forming the first contact hole CH1 in the second insulating film 513, an area of the active pattern 1021 located in an area corresponding to an area in which the first contact hole CH1 is formed may be a conductive area 1021a.

The conductive area 1021a of the active pattern 1021 may be an area conductorized by plasma. A non-conductive area 1021b of the active pattern 1021 may be an area in which conductorizing have not been developed because the non-conductive area 1021b was covered by the conductive pattern 1021 and plasma could not affect the active pattern 821.

However, embodiments of the present disclosure are not limited, and depending on the dry etching process conditions, the conductive region 1021a of the active pattern 1021 may be changed. For example, a part of the conductive region 1021a of the active pattern 1021 may overlap a part of the second insulating film 513.

The third insulating film 514 may be disposed on the second insulating film 513.

The third insulating film 514 may include the second contact hole CH2 overlapping the first contact hole CH1 of the second insulating film 513. The third insulating film 514 may expose a part of the upper surface of the active pattern 1021 of the first active layer 1020 through the second contact hole CH2.

The third conductive layer 360 may contact the conductive area 1021a of the active pattern 1021 through the first contact hole CH1 of the second insulating film 513 and the second contact hole CH2 of the third insulating film 514.

Meanwhile, as shown in FIGS. 10 and 11, the first opening 1022a of the conductive pattern 1022 of the first active layer 1020 may overlap the conductive area 1021a of the active pattern 1021. In other words, the conductive pattern 1022 of the first active layer 1220 may not overlap the conductive area 1021a of the active pattern 1021.

Figure 12:
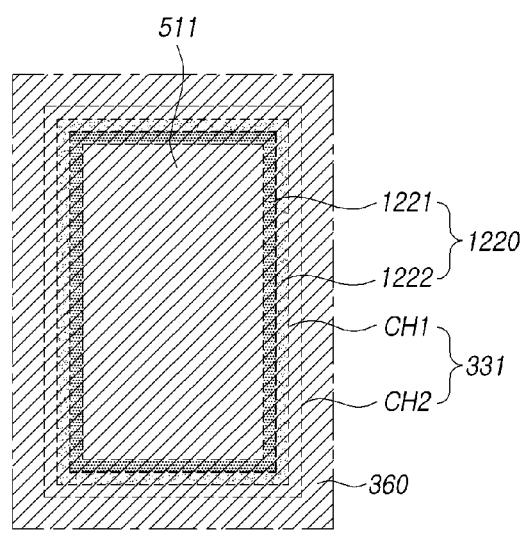
FIG. 12 illustrates an area in which a first active layer and a third conductive layer contact in an area corresponding to a second node of a driving transistor in still another embodiment in the display device according to one embodiment of the present disclosure.
Figure 13:
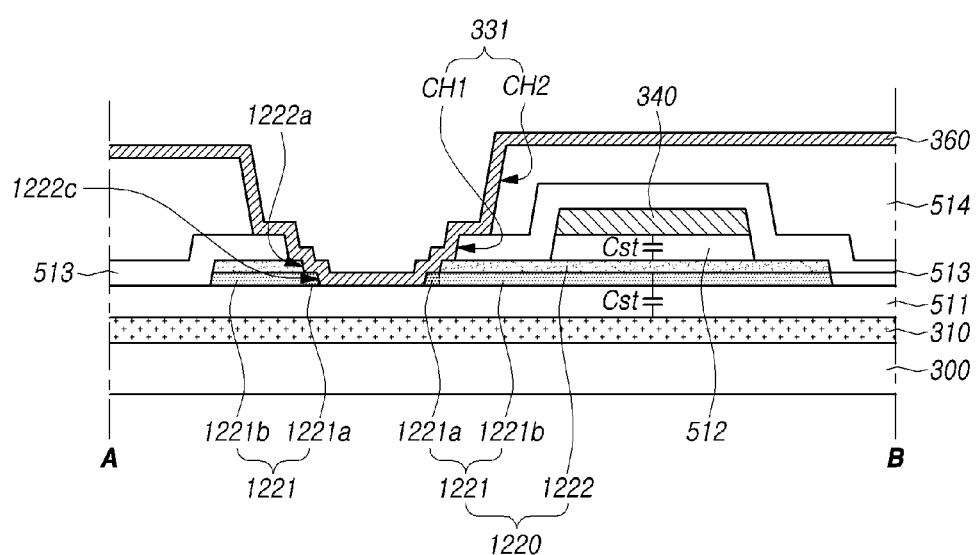
FIG. 13 is a cross-sectional view taken along with line A-B of FIG. 3, and illustrates a structure of the display panel including the structure where the first active layer and the third conductive layer contacts as illustrated in FIG. 12 according to one embodiment of the present disclosure.

Next, in some embodiments, referring to FIGS. 12 and 13, discussions will be conducted on structures different from the structures described above.

FIG. 12 illustrates an area in which a first active layer and a third conductive layer contact in an area corresponding to a second node of a driving transistor in still another embodiment in the display device according to one embodiment of the present disclosure. FIG. 13 is a cross-sectional view taken along with line A-B of FIG. 3, and illustrates a structure of the display panel including the structure where the first active layer and the third conductive layer contacts as illustrated in FIG. 12 according to one embodiment of the present disclosure.

In the following description, some configurations, effects etc. of the embodiments or examples discussed above may not be repeatedly described for convenience of description. Further, in the following description, like reference numerals will be used for configurations or elements equal to those of embodiments or examples described above.

Referring to FIG. 12, in the organic light emitting display device 100 according to aspects of the present disclosure, each of a part of an upper surface of an active pattern 1221 of the first active layer 1220 and a conductive pattern 1222 of the first active layer 1220 may be exposed by a first contact hole CH1 of a second insulating film and a second contact hole CH2 of a third insulating film.

In addition, each of the active pattern 1221 and the conductive pattern 1222 of the first active layer 1220 may have an opening, and the opening of the active pattern 1221 and the opening of the conductive pattern 1222 may be disposed to overlap each other and expose a part of an upper surface of the buffer layer 511.

In a plan view, an area of the opening of the conductive pattern 1222 may be greater than an area of the active pattern 1221, and thus, a part of the upper surface of the active pattern 1221 may be exposed by the opening of the conductive pattern 1222. In other words, the part of the upper surface of the active pattern 1221 may not overlap the conductive pattern 1222.

In addition, each of the openings of the active pattern 1221 and the conductive pattern 1222 of the first active layer 1220 may also overlap the first contact hole CH1 of the second insulating film and the second contact hole CH2 of the third insulating film.

In a plan view, an area of the first contact hole CH1 of the second insulating film and an area of the second contact hole CH2 of the third insulating film may be greater than an area of the conductive pattern 1222 of the first active layer 1220, and thus, a part of the upper surface of the conductive pattern 1222 may be exposed by the first contact hole CH1 of the second insulating film and the second contact hole CH2 of the third insulating film. In other words, a part of the upper surface of the conductive pattern 1222 may not overlap the second insulating film and the third insulating film.

The third conductive layer 360 may contact a part of an upper surface of the buffer layer 511, a part of the upper surface of the active pattern 1221 of the first active layer 1220, and a part of the upper surface of the conductive pattern 1222 of the first active layer 1220.

Here, the area of the active pattern 1221 of the first active layer 320 contacting the third conductive layer 360 may be a conductorized area.

Specifically, referring to FIG. 13, the conductive pattern 1222 of the first active layer 1220 disposed on the buffer layer 511 may include a first opening 1222a, and the active pattern 1221 may include a second opening 1221c.

The second opening 1221c of the active pattern 1221 and the first opening 1222a of the conductive pattern 1222 may overlap each other. The second opening 1221c of the active pattern 1221 and the first opening 1222a of the conductive pattern 1222 may expose a part of an upper surface of the buffer layer 511.

The first opening 1222a of the conductive pattern 1222 may overlap a part of the upper surface of the active pattern 1221. That is, the conductive pattern 1222 may be disposed to expose the part of the upper surface of the active pattern 1221.

The first contact hole CH1 of the second insulating film 513 disposed on the first active layer 1220 and the second contact hole CH2 of the third insulating film 514 may overlap each other. Each of the first contact hole CH1 of the second insulating film 513 and the second contact hole CH2 of the third insulating film 514 overlaps even the second opening 1221c of the active pattern 1221 and the first opening 1222a of the conductive pattern 1222, and thus, can expose the part of the upper surface of the buffer layer 511.

Meanwhile, in order to form the first contact hole CH1 in the second insulating film 513, the dry etching process using plasma may be used, and due to the dry etching process, respective openings 1222a and 1221c may be formed in the conductive pattern 1222 and the active pattern 1221.

In the process of forming the first contact hole CH1 in the second insulating film 513, a part of the active area that corresponds to an area in which the first contact hole CH1 is formed and that is located in an area not overlapping the conductive pattern 1222 may become conductorized, and as a result, a conductive area 1221a may be provided. Further, a part of the active pattern 1221 overlapping the conductive pattern 1222 may be a non-conductive area 1221b.

The conductive pattern 1222 may contact the conductive area 1221a at a boundary between the conductive area 1221a and the non-conducting area 1221b of the active pattern 1221.

However, embodiments of the present disclosure are not limited thereto. For example, when a part of the conductive area 1221a of the active pattern 1221 overlaps the conductive pattern 1222, the conductive pattern 1222 may contact the conductive area 1221a at the boundary between the conductive area 1221a and the non-conducting area 1221b of the active pattern 1221 and further contact a part of the upper surface of the conductive area 621a.

As described above, the first insulating film 512 may be disposed on a part of the upper surface of the conductive pattern 1222 of the first active layer 1220, and the plate 340 may be disposed on the first insulating film 512

The first conductive layer 310, the conductive pattern 1222 of the first active layer 1220, and the plate 340 may overlap one another. Each of the first conductive layer 310, the conductive pattern 1222 of the first active layer 1220, and the plate 340 may serve as an electrode of the storage capacitor Cst.

The third insulating film 514 may be disposed on the plate 340, and the third conductive layer 360 may be disposed on the third insulating film 514.

The third conductive layer 360 may contact a part of the upper surface of the buffer layer 511 exposed through the opening 1221c of the active pattern 1221, the opening 1222a of the conductive pattern 1222, the first contact hole CH1 of the second insulating film 513, and the second contact hole CH2 of the third insulating film 514.

Further, the third conductive layer 360 may contact the upper surface and a side surface of the active pattern 1221 exposed through the opening 1222a of the conductive pattern 1222, the first contact hole CH1 of the second insulating film 513, and the second contact hole CH2 of the third insulating film 514. The third conductive layer 360 may contact the conductive area 1221a of the active pattern 1221.

Further, the third conductive layer 360 may contact the upper surface and a side surface of the conductive pattern 122 exposed by the first contact hole CH1 of the second insulating layer 513 and the second contact hole CH2 of the third insulating layer 514.

In other words, the third conductive layer 360 may contact the conductive area 1221a of the active pattern 1221 of the first active layer 1220 and also contact the conductive pattern 1222 of the first active layer 1220.

Accordingly, the third conductive layer 360 may be electrically connected to the conductive pattern 1222 and the active pattern 1221 of the first active layer 1220. In other words, in an area corresponding to the second node N2 of the driving transistor, the third conductive layer 360 may be electrically connected to the first active layer 1220.

Although the structure of the organic light emitting display device according to aspects of the present disclosure has been described by focusing on the structure in which the first active layer includes the active pattern and the conductive pattern with reference to FIGS. 4 to 13, however, embodiments of the present disclosure are not limited thereto.

Discussions will be conducted on embodiments in which a first active layer has a structure different from that of the first active layer of FIGS. 4 to 13 described above with reference to FIGS. 14 and 15.

Figure 14:
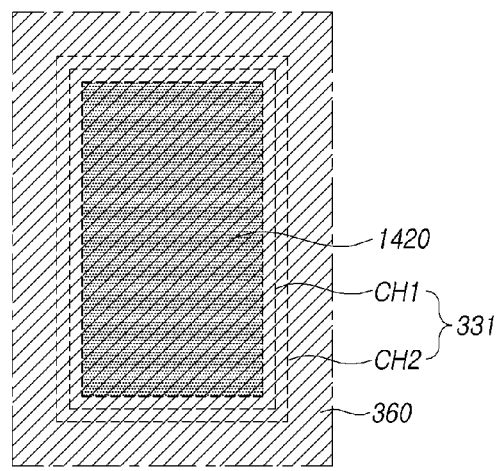
FIG. 14 schematically illustrates an area in which a first active layer and a third conductive layer contact in an area corresponding to a second node of a driving transistor of the display device according to one embodiment of the present disclosure.
Figure 15:
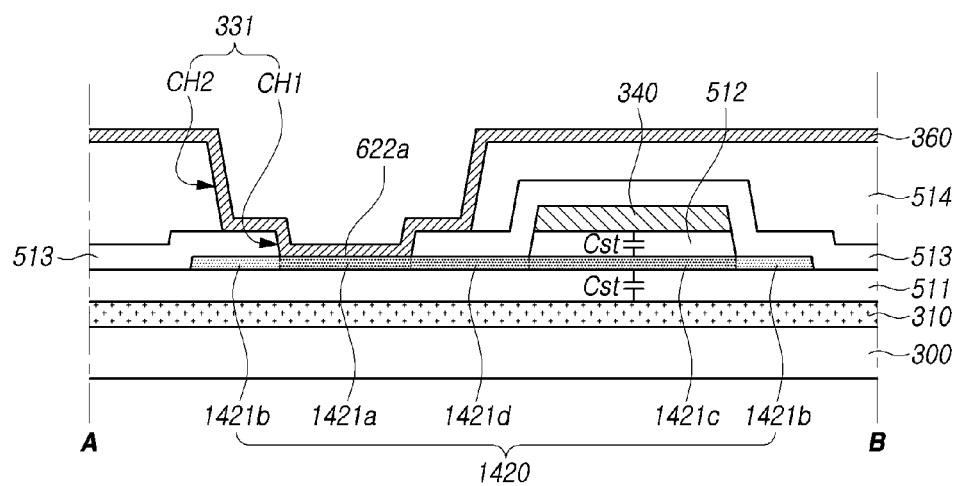
FIG. 15 is a cross-sectional view taken along with line A-B of FIG. 3, and illustrates a structure of the display panel including the structure where the first active layer and the third conductive layer contacts as illustrated in FIG. 14 according to one embodiment of the present disclosure.

FIG. 14 schematically illustrates an area in which a first active layer and a third conductive layer contact in an area corresponding to a second node of a driving transistor of the display device according to one embodiment of the present disclosure. FIG. 15 is a cross-sectional view taken along with line A-B of FIG. 3, and illustrates a structure of the display panel including the structure where the first active layer and the third conductive layer contacts as illustrated in FIG. 14 according to one embodiment of the present disclosure.

In the following description, some configurations, effects etc. of the embodiments or examples discussed above may not be repeatedly described for convenience of description. Further, in the following description, like reference numerals will be used for configurations or elements equal to those of embodiments or examples described above.

Referring to FIG. 14, in the organic light emitting display device 100 according to aspects of the present disclosure, a part of an upper surface of the first active layer may be exposed by a first contact hole CH1 of a second insulating film and a second contact hole CH2 of a third insulating film.

In addition, the upper surface of the first active layer 1420 exposed by the first and second contact holes CH1 and CH2 may contact a third conductive layer 360 disposed on the third insulating film.

Specifically, referring to FIG. 15, the first active layer 1420 may be formed of a single layer.

In this case, the first active layer 1420 may be formed of an oxide semiconductor.

The first insulating film 512 may be disposed on a part of the upper surface of the first active layer 1420.

The plate 340 may be disposed on the first insulating film 512.

The second insulating film 513 including the first contact hole CH1 and the third insulating film 514 including the second contact hole CH2 may be disposed over the substrate 300 over which the plate 340 is disposed. The second insulating film 513 and the third insulating film 514 may expose a part of the top surface of the first active layer 1420 through the first contact hole CH1 and the second contact hole CH2.

Here, the first contact hole CH1 of the second insulating film 513 may be formed through the dry etching process using plasma. Further, in the process of forming the first contact hole CH1 in the second insulating film 513, an area of the first active layer 1420 located in an area corresponding to an area in which the first contact hole CH1 is formed may become a conductive area 1421a.

The third conductive layer 360 may be disposed on the third insulating film 514.

The third conductive layer 360 may contact the conductive area 1421a of the first active layer 1420 through the first contact hole CH1 of the second insulating film 513 and the second contact hole CH2 of the third insulating film 514.

In some embodiments, the plate 340 and the first conductive layer 310 may overlap each other, and each of the plate 340 and the first conductive layer 310 may serve as an electrode of the storage capacitor Cst.

Further, the area of the first active layer 1420 overlapping the first conductive layer 310 and the plate 340 may be a conductive area 1421b. In some embodiments, the conductive area 1421c of the first active layer 1420 overlapping the first conductive layer 310 and the plate 340 may be included in an electrode of the storage capacitor Cst.

For an electrical connection between the conductive area 1421a of the first active layer 1420 contacting the third conductive layer 360 and the conductive are 1421c of the first active layer 1420 overlapping the first conductive layer 310 and the plate 340, a part of the first active layer 1420 including the conductive area 1421a of the first active layer 1420 contacting the third conductive layer 360 and the conductive are 1421c of the first active layer 1420 overlapping the first conductive layer 310 and the plate 340 may also be conductorized.

For example, in a cross sectional view, an area of the active layer 1420 located between the conductive area 1421a of the first active layer 1420 contacting the third conductive layer 360 and the conductive are 1421c of the first active layer 1420 overlapping the first conductive layer 310 and the plate 340 may be a conductive area 1421d.

The conductive are 1421c of the first active layer 1420 overlapping the first conductive layer 310 and the plate 340, and an area, i.e., a conductive area 1421d, of the active layer 1420 located between the conductive area 1421a of the first active layer 1420 contacting the third conductive layer 360 and the conductive are 1421c of the first active layer 1420 may become conductorized, however, embodiments of the present disclosure are not limited thereto.

The first active layer 1420 may include a non-conductive area 1421b. For example, as shown in FIG. 15, the non-conductive area 1421b may be located on one side of the conductive area 1421a of the first active layer 1420 contacting the third conductive layer 360. Further, the non-conductive area 1421b may be located even on one side of the conductive area 1421c of the first active layer 1420 overlapping the first conductive layer 310 and the plate 340.

The non-conductive area 1421b may include a channel region of the first active layer 1420. Through this, the corresponding transistor (e.g., a driving transistor) can be smoothly driven.

In another embodiment, the non-conductive area 1421b of the first active layer 1420 may include only the channel region of the first active layer 1420.

As described with reference to FIGS. 3 to 15, there has been provided the organic light emitting display device 100 according to aspects of the present disclosure having the structure in which the third conductive layer 360 does not contact the second conductive layer 330 and contacts the first active layer 1420 in an area corresponding to the second node of the driving transistor. As a result, the size of the second conductive layer 330 included in the second node of the driving transistor can be reduced, and the storage capacitor (Cst) with a high capacity can be implemented by designing the plate 340 that is one of the electrodes of the storage capacitor Cst to have a large area.

Next, discussions will be conducted on comparing capacities of respective storage capacitors of the organic light emitting display device according to aspects of the present disclosure and an organic light emitting display device according to a comparative example.

FIG. 16 is a diagram comparing capacities of respective storage capacitors of an organic light emitting display device according one embodiment of the present disclosure and an organic light emitting display device according to a comparative example.

An organic light emitting display device according to one embodiment of the present disclosure used in FIG. 16, may include the structures shown in FIGS. 4 and 5. The organic light emitting display device according to the comparative example may have a structure in which a first electrode (corresponding to the third conductive layer according to embodiments described herein) of an organic light emitting element contacts a gate electrode pattern (corresponding to the second conductive layer according to embodiments described herein) at the second node of the driving transistor.

Further, in FIG. 16, a first sub-pixel is a sub-pixel including a light emitting element emitting red (R), a second sub-pixel is a sub-pixel including a light emitting element emitting blue (B), and a third sub-pixel may be a sub-pixel including a light emitting element emitting white (W), and a fourth sub-pixel may be a sub-pixel including a light emitting element emitting green (G).

A size of the first sub-pixel of the organic light emitting display device according to the embodiment and a size of the first sub-pixel of the organic light emitting display device according to the comparative example may correspond to each other, and a size of the second sub-pixel of the organic light emitting display device according to the embodiment and a size the second sub-pixel of the organic light emitting display device according to the comparative example may correspond to each other, and a size of the third sub-pixel of the organic light emitting display device according to the embodiment and a size of the third sub-pixel of the organic light emitting display device according to the comparative example may correspond to each other, and a size of the fourth sub-pixel of the organic light emitting display device according to the embodiment and a size of the fourth sub-pixel of the organic light emitting display device according to the comparative example may correspond to each other.

Referring to FIG. 16, it can be seen that the capacities of storage capacitors disposed in each of the first to fourth sub-pixels according to the embodiment are larger than the capacities of storage capacitors disposed in each of the first to fourth sub-pixels according to the comparative example.

That is, in an area corresponding to the second node of the driving transistor of each sub-pixel of the organic light emitting display device according to the embodiment, as the third conductive layer does not contact the second conductive layer, and contact the first active layer, as a result, there are provided effects of increasing the size of the storage capacitor and increasing the capacity of the storage capacitor.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. An organic light emitting display device comprising:
a substrate;
a first conductive layer disposed on the substrate;
a buffer layer disposed on the first conductive layer;
an active layer disposed on the buffer layer;
a first insulating film disposed on or over the active layer, the first insulating film overlapping a part of an upper surface of the active layer;
a second insulating film disposed on or over the first insulating film, the second insulating film including a first contact hole exposing the part of the upper surface of the active layer;
a third insulating film disposed on the second insulating film, the third insulating film including a second contact hole overlapping the first contact hole; and
an electrode of an organic light emitting element disposed on the third insulating film, the electrode contacting the active layer through the first contact hole and the second contact hole,
wherein an area in which the active layer and a second conductive layer contact is included in a node at which a reference voltage is applied to a driving transistor.

2. The organic light emitting display device according to claim 1, wherein the active layer includes at least one of zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO), and
wherein an area in which the active layer overlaps the first contact hole is a conductive area.

3. The organic light emitting display device according to claim 1, wherein the active layer includes an active pattern disposed on the buffer layer and at least one layer of a conductive pattern disposed on the active pattern.

4. The organic light emitting display device according to claim 3, wherein the active pattern includes at least one of zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

5. The organic light emitting display device according to claim 3, wherein the conductive pattern includes any one of either a metal such as aluminum (Al), gold (Au), silver (Ag), copper (Cu), tungsten (W), molybdenum (Mo), chromium (Cr), tantalum (Ta), or titanium (Ti), or an alloy two or more of aluminum (Al), gold (Au), silver (Ag), copper (Cu), tungsten (W), molybdenum (Mo), chromium (Cr), tantalum (Ta), or titanium (Ti).

6. The organic light emitting display device according to claim 3, wherein the first contact hole exposes a part of an upper surface of the conductive pattern, and
wherein the electrode of the organic light emitting element contacts the upper surface of the conductive pattern through the first contact hole and the second contact hole.

7. The organic light emitting display device according to claim 3, wherein the first contact hole exposes a part of an upper surface of the conductive pattern, and
wherein the conductive pattern includes a first opening exposing a part of an upper surface of the active pattern in an area overlapping the first contact hole.

8. The organic light emitting display device according to claim 7, wherein an area of the first opening corresponds to an area of the first contact hole.

9. The organic light emitting display device according to claim 7, wherein an area of the first opening is smaller than an area of the first contact hole, and
wherein the second insulating film exposes the part of the upper surface of the conductive pattern through the first contact hole.

10. The organic light emitting display device according to claim 9, wherein the active pattern includes a second opening overlapping the first opening of the conductive pattern, and
wherein the active pattern exposes a part of an upper surface of the buffer layer through the second opening.

11. The organic light emitting display device according to claim 10, wherein an area of the second opening is smaller than an area of the first opening.

12. The organic light emitting display device according to claim 7, wherein an area of the first opening is greater than an area of the first contact hole, and wherein the second insulating film surrounds the upper surface and a side surface of the conductive layer.

13. The organic light emitting display device according to claim 7, wherein the part of the active pattern exposed by the conductive pattern is a conductive area.

14. The organic light emitting display device according to claim 13, wherein the conductive pattern contacts the conductive area.

15. The organic light emitting display device according to claim 1, further comprising a plate disposed between the first insulating film and the second insulating film, wherein the plate forms a storage capacitor by overlapping a part of the first conductive layer and a part of the active layer.

16. The organic light emitting display device according to claim 1, wherein the buffer layer includes a third contact hole exposing a part of an upper surface of the first conductive layer, wherein the first insulating film includes a fourth contact hole exposing the part of the upper surface of the first conductive layer and the part of the upper surface of the active layer, and wherein the third contact hole and the fourth contact hole overlap each other without overlapping the first contact hole and the second contact hole.

17. The organic light emitting display device according to claim 16, further comprising a second conductive layer disposed between the first insulating film and the second insulating film and spaced apart from a plate disposed between the first and second insulating films, wherein the second conductive layer contacts the part of the upper surface of the first conductive layer and the part of the upper surface of the active layer through the third contact hole and the fourth contact hole.

18. The organic light emitting display device according to claim 17, wherein an area of the second conductive layer contacting the first conductive layer and the active layer is included in a node at which a reference voltage is applied to a driving transistor.

19. An organic light emitting display panel comprising:

a substrate;

a first conductive layer disposed on the substrate;

a buffer layer disposed on the first conductive layer;

an active layer disposed on the buffer layer;

a first insulating film disposed on or over the active layer, the first insulating film overlapping a part of an upper surface of the active layer;

a plate disposed on the first insulating film;

a second insulating film disposed on or over the plate and the first insulating film, the second insulating film including a first contact hole exposing the part of the upper surface of the active layer;

an electrode of an organic light emitting element disposed on the second insulating film, the electrode contacting the active layer through the first contact hole, wherein each of the first conductive layer, the active layer, and the plate form an electrode of a storage capacitor, wherein the plate of the storage capacitor does not overlap the first contact hole.

20. The organic light emitting display panel according to claim 19, wherein the active layer includes an active pattern disposed on the buffer layer and at least one layer of a conductive pattern disposed on the active pattern.

* * * * *